(12) United States Patent
Karraker et al.

(10) Patent No.: US 9,419,529 B2
(45) Date of Patent: Aug. 16, 2016

(54) DC BUS VOLTAGE MEASUREMENT CIRCUIT

(71) Applicant: ABB Inc., Cary, NC (US)

(72) Inventors: Douglas Karraker, New Berlin, WI (US); Alpo Vallinmaki, Mukwonago, WI (US)

(73) Assignee: ABB INC., Cary, NC (US)

( * ) Notice: Subject to any disclaimer, the term of this patent is extended or adjusted under 35 U.S.C. 154(b) by 221 days.

(21) Appl. No.: 14/196,241

(22) Filed: Mar. 4, 2014

(65) Prior Publication Data
US 2015/0253359 A1    Sep. 10, 2015

(51) Int. Cl.
*G01R 15/16* (2006.01)
*G01R 19/00* (2006.01)
*H02M 3/335* (2006.01)

(52) U.S. Cl.
CPC ........... *H02M 3/33523* (2013.01); *G01R 15/16* (2013.01); *H02M 3/335* (2013.01)

(58) Field of Classification Search
None
See application file for complete search history.

(56) References Cited

U.S. PATENT DOCUMENTS

| | | | | |
|---|---|---|---|---|
| 3,496,383 A * | 2/1970 | Tomsa | ................... | G01R 19/04 327/50 |
| 3,660,750 A * | 5/1972 | Businelli | ............ | H02M 3/3388 363/23 |
| 4,017,782 A * | 4/1977 | Wheeler | ........... | H02M 3/33507 363/19 |
| 5,278,748 A * | 1/1994 | Kitajima | ................. | H02M 1/34 363/21.02 |
| 6,101,105 A * | 8/2000 | Gilmore | ............ | H02M 3/33561 323/902 |
| 8,934,267 B2 * | 1/2015 | He | ....................... | H02M 3/3378 363/17 |
| 9,024,609 B2 * | 5/2015 | Milavec | .................... | H02J 1/10 323/224 |
| 2009/0284990 A1 * | 11/2009 | Pollak | ................... | H02M 3/156 363/21.02 |
| 2012/0098512 A1 * | 4/2012 | Kirchner | .............. | H02M 3/156 323/284 |

* cited by examiner

*Primary Examiner* — Jermele M Hollington
(74) *Attorney, Agent, or Firm* — Taft Stettinius & Hollister LLP

(57) ABSTRACT

A voltage measuring device includes an input configured to be coupled to a secondary of an inductive coupling of a DC to DC voltage converter. A switch coupled to the input forms a discharge path parallel to a sampling capacitor dependent on the voltage at the input equaling or exceeding a first voltage threshold and independent of an output voltage at the output of the device. The sampling capacitor is coupled to the output. A rectifier in series with the sampling capacitor is biased to conduct upon the input voltage, minus the output voltage, equaling or exceeding a second voltage.

20 Claims, 3 Drawing Sheets

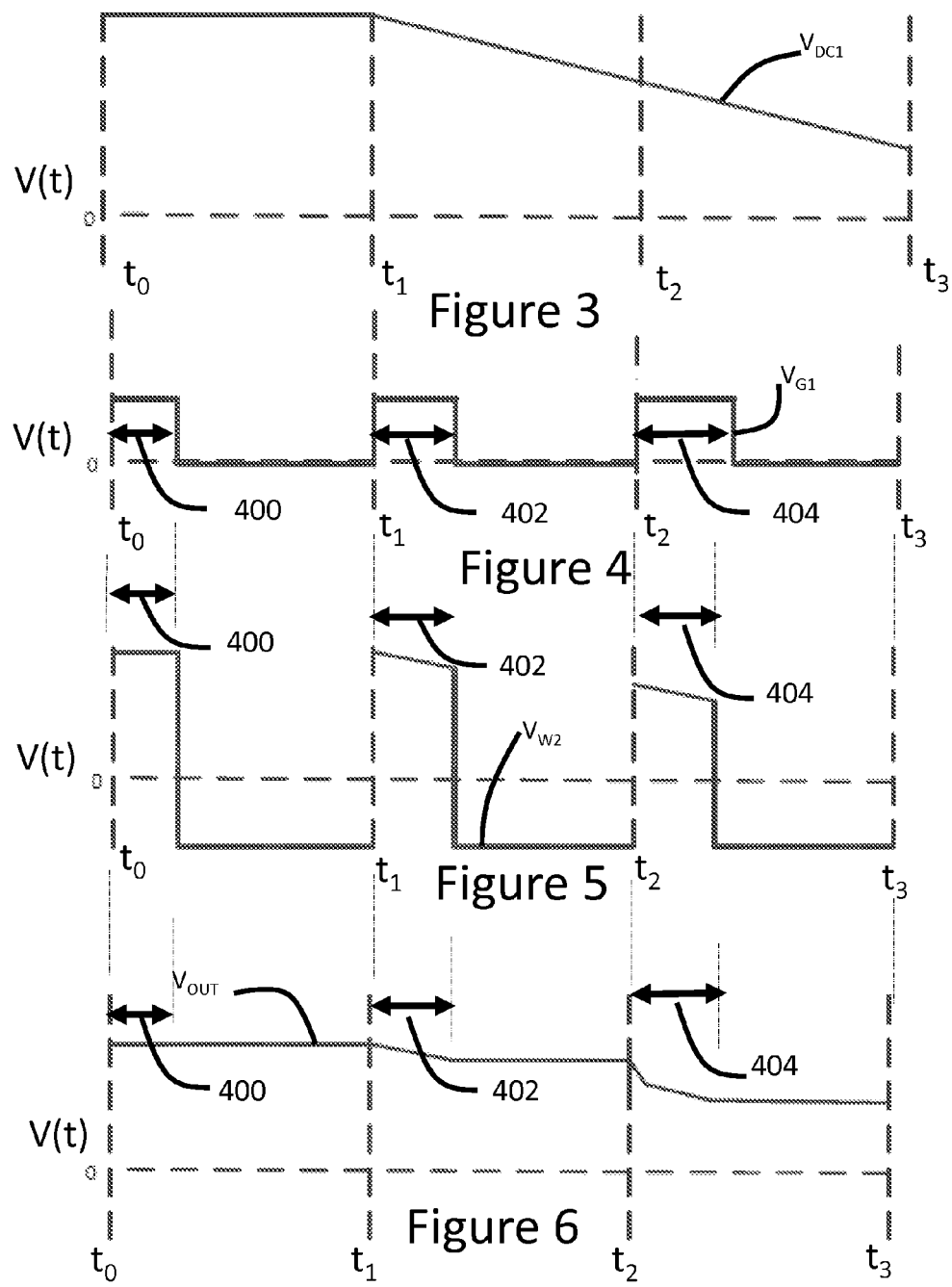

ered to as a flyback circuit 206 includes the DC voltage source

DC BUS VOLTAGE MEASUREMENT CIRCUIT

FIELD OF INVENTION

The teachings herein relate to DC bus voltage measurement. In particular, the teachings herein relate to voltage measurement of unregulated DC bus voltages that can provide energy for a regulated DC output galvanically isolated from the unregulated DC bus voltage.

BACKGROUND

DC electronic power supplies, such as flyback circuits, can use an unregulated DC voltage supply and a DC to DC converter that converts the unregulated voltage into a regulated output DC voltage that can be used for applications requiring such a regulated DC supply, such as certain electronic circuitry, inverters or electric motors. A common feature of such DC to DC converters is the requirement for galvanic isolation between the unregulated DC voltage bus and the regulated output voltage.

While knowledge of the voltage at the unregulated DC supply can be beneficial, direct detection of the unregulated supply can be problematic as such detection circuitry can involve additional components for isolating the unregulated source from the regulated power supply. Indirect detection can suffer from inaccurate measurements that are not reflective of the present value of the voltage on the unregulated side. For example, relatively short transients or sudden withdrawal of the unregulated DC supply may not be reflected in a sample and hold peak detection circuitry. Such circuitry can be in the form of an RC circuit for which the chosen time constants can be too long to react to phenomenon occurring at time scales shorter than the RC time constant.

SUMMARY

A voltage measuring device includes an input configured to be coupled to a secondary of an inductive coupling of a DC to DC voltage converter. A switch coupled to the input forms a discharge path parallel to a sampling capacitor dependent on the voltage at the input equaling or exceeding a first voltage threshold and independent of an output voltage at the output of the device. The sampling capacitor is coupled to the output. A rectifier in series with the sampling capacitor is biased to conduct upon the input voltage, minus the output voltage, equaling or exceeding a second voltage.

BRIEF DESCRIPTION OF THE DRAWINGS

In the accompanying drawings, structures and methods are illustrated that, together with the detailed description provided below, describe aspects of a system for measuring DC bus voltage. It will be noted that a single component may be designed as multiple components or that multiple components may be designed as a single component.

Further, in the accompanying drawings and description that follow, like parts are indicated throughout the drawings and written description with the same reference numerals, respectively.

FIG. 3 illustrates a graph of the voltage $V_{DC1}$ found in converter 200 versus time.

FIG. 4 illustrates a graph of the voltage $V_{G1}$ found in converter 200 versus time.

FIG. 5 illustrates a graph of the voltage $V_{W2}$ found in converter 200 versus time.

FIG. 6 illustrates a graph of the voltage $V_{OUT}$ found in converter 200 versus time.

DETAILED DESCRIPTION

Figure 1:
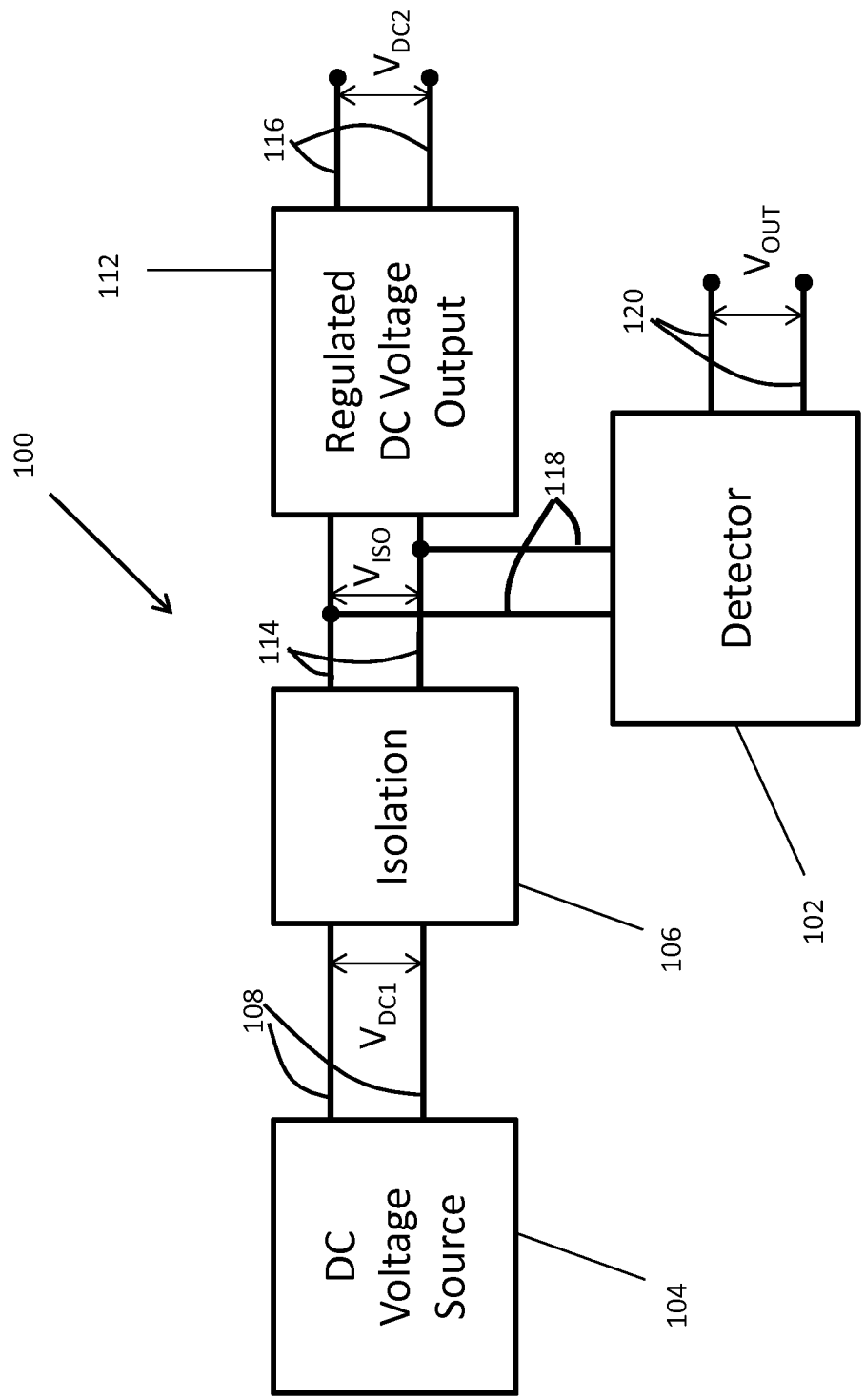
FIG. 1 illustrates a diagram of a DC to DC converter 100.

FIG. 1 shows an arrangement of a DC to DC converter 100 having a detector 102 according to the present teachings. A DC voltage source 104 is coupled to an isolation coupling module 106 through leads 108. According to one aspect of the present teachings, the voltage $V_{DC1}$ provided by DC voltage source 104 across leads 108 is unregulated. Isolation coupling module 106 can include an isolation transformer or other inductive circuitry that allows galvanically isolated energy transfer from the DC voltage source 104. Isolation coupling module 106 provides a voltage $V_{ISO}$ to the regulated DC voltage output module 112 through leads 114. According to one aspect of the present teachings, the voltage $V_{ISO}$ provided by the isolation coupling circuitry 106 is modulated. According to another aspect of the present teachings, the voltage $V_{ISO}$ provided by the isolation coupling circuitry 106 is modulated between at least two states having opposite polarity relative to one another, such that modulating the isolation circuitry from one state to another state results in $V_{ISO}$ switching in polarity. When the isolation coupling circuitry 106 is modulated from one state to another, the polarity of $V_{ISO}$ in the initial state will be opposite to the polarity of $V_{ISO}$ in the modulated state. Modulation of isolation coupling circuitry 106 can be effected by selectively switching current through a primary of a transformer. According to one aspect of the present teachings, modulation of the voltage across the secondary winding of such a transformer can be done by modulating the current across the primary winding of the transformer. The regulated DC voltage output module 112 receives the voltage $V_{ISO}$ and produces a regulated voltage $V_{DC2}$ as its output across leads 116.

Detector circuit 102 receives the output voltage $V_{ISO}$ of isolation module 106 through leads 118. As described further below with reference to FIG. 2, the detector receives the voltage $V_{ISO}$ and provides an output voltage $V_{OUT}$ across leads 120 from which the value of the voltage $V_{DC1}$ can be estimated. According to one aspect of the present teachings, the detector circuit 102 is galvanically isolated from the DC voltage source 104.

Figure 2:
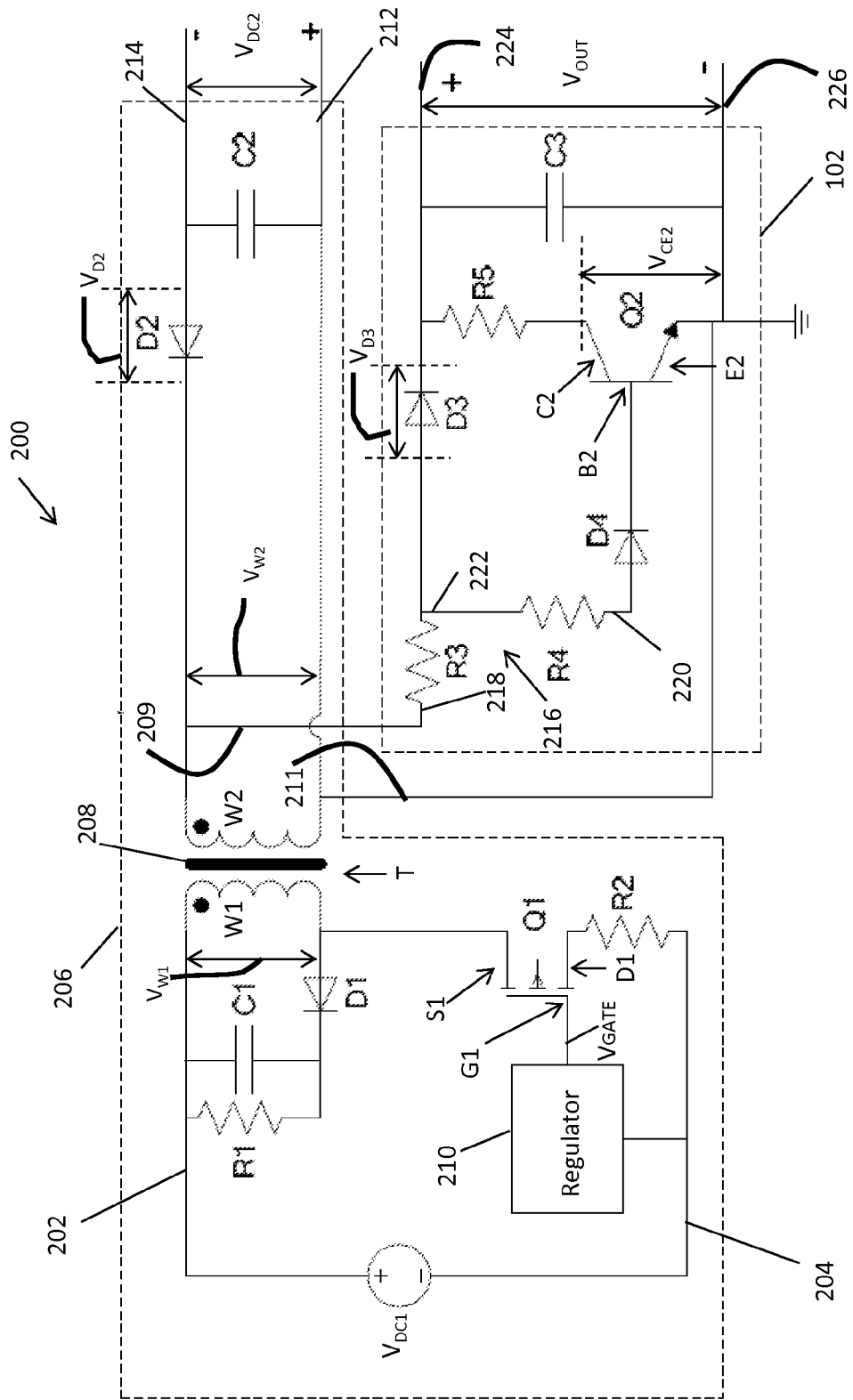
FIG. 2 illustrates a circuit diagram of DC to DC converter 200.

With reference to FIG. 2, a circuit 200 includes an independent DC voltage source $V_{DC1}$ which produces a DC voltage across positive rail 202 and negative rail 204. According to one aspect of the present teachings, the DC voltage source $V_{DC1}$ is unregulated. According to another aspect of the present teachings, the DC voltage source $V_{DC1}$ is time-varying. In FIG. 2, a DC to DC voltage converter 206, also referred to as a flyback circuit 206 includes the DC voltage source $V_{DC1}$. However, according to other aspects of the present teachings, a DC voltage source need not be included in a DC to DC converter 206. Such a DC voltage to DC voltage converter 206 can instead be configured to be coupled to an independent DC voltage source that can provide the voltage $V_{DC1}$.

The flyback circuit 206 has a transformer T having a first, or primary, winding W1 having N1 turns, a second, or secondary, winding W2 having N2 turns and a core 208, which can be iron, steel or other material having relatively high magnetic permeability suitable for operation within a transformer. Transformer T serves as an isolating inductive coupling of the DC voltage source with the DC voltage output. According to other aspects of the present teachings, an air core can be implemented. A switch Q1 is coupled to the primary winding N1, and is in a series relationship with resistor R2. According to one aspect of the present teachings, switch Q1 is an N-type enhancement MOSFET. However, other forms of switches can be substituted for illustrated switch Q1, including other types of MOSFETs, such as P-Channel MOSFETs, transistors and other semiconductor switches in accordance with the present teachings.

The flyback circuit 206 isolated the input DC voltage $V_{DC1}$ from the output regulated DC voltage $V_{DC2}$. However, the present teachings can be applied to other DC to DC converters. For example, the isolating DC to DC converter need not be a flyback converter, but instead can be another DC to DC converter for which the isolating element is inductive, such as a transformer, and where the polarity of the isolated output is reversed when the output of the isolating transformer T is modulated from a state during which the voltage on the secondary is determined by the value of $V_{DC1}$ and another state during which the voltage on the secondary is independent of $V_{DC1}$.

With further reference to FIG. 2, resistor R1, capacitor C1 and diode D1 form a snubber circuit allowing discharge of the winding W1 when the switch Q1 is in its non-conducting or off state. The switch regulator 210 is connected to the negative voltage rail 204 and to the gate of switch Q1. The regulator 210 can be configured to provide a signal $V_{GATE}$ to the gate G1 of switch Q1, which switches the switch Q1 from conducting to non-conducting states, allowing current to flow between the source S1 and drain D1, which are in a series relationship with resistor R2.

During operation, switch Q1 can be turned on for time $t_{on}$, which if the resistor R2 is selected to have a sufficiently small resistance, results in the voltage $V_{W1}$ being about equal to $V_{DC1}$ on the W1 transformer winding as measured from the dot end relative to the non-dotted end. This results in a voltage $V_{DC1} \times (N2/N1)$ on the transformer secondary winding W2 as measured from the dotted end relative to the non-dotted end. During this time period $t_{on}$, the diode D2 is reverse biased, which allows capacitor C2 to provide current to the power supply load across positive lead 212 and negative lead 214. Switch Q1 can be turned off for a time period $t_{off}$ which allows the energy stored in primary winding W1 to discharge through the snubber circuit formed by D1, C1 and R1. The discharge of the primary winding coincides with current flow in the secondary winding W2 such that diode D2 becomes forward-biased and begins to conduct, thereby providing current to capacitor C2 and charging C2. The voltage across the secondary $V_{W2}$ during $t_{off}$ is $V_{DC2}$ minus the forward bias voltage drop $V_{D2}$ of the diode D2. According to one aspect of the present teachings, the regulator 210 of the flyback circuit 206 switches switch Q1 alternately between on and off states for varying durations of time, respectively, and as required to provide and maintain the desired voltage $V_{DC2}$ across leads 212, 214.

With continued reference to FIG. 2, the detection circuit 102 has input leads 209, 211 that form an input to the detection circuit 102 connected in parallel across the secondary winding W2 of transformer T. It should be noted that the choice of connection of leads 209, 211 can be switched, which would have the effect of switching the polarity of the voltage across leads 209, 211. Measurement of both negative voltages and positive voltages can be performed according to the present teachings. The detection circuit 102 includes a voltage divider 216 having resistors R3 and R4. It should be noted that resistor R4 can be eliminated by, for example, replacement of Q2 with a field effect transistor ("FET"), thereby obviating the need for resistor R4. According to one aspect of the present teachings, the amount of current flowing through R4 is negligible during both $t_{on}$ and $t_{off}$ and R4 has negligible effect on the output of the detection circuit 102. The illustrated voltage divider 216 has a high voltage side 218 connected to one end of the winding W2 and a low voltage side 220 connected to the anode of rectifier D4. The output 222 of the voltage divider is connected to the anode of rectifier D3. In the illustrated case, both D3 and D4 are rectifying silicon diode. It will be noted that other forms of rectifiers can also be implemented, such as the various forms of solid state rectifiers.

During the time $t_{on}$, the positive voltage $V_{W2}$ on the transformer secondary winding W2, which according to one aspect of the present teachings is about $V_{DC1} \times (N2/N1)$, forward biases the diode D3 in detection circuit 102. This in turn allows current to flow to the sampling capacitor C3, which is coupled as shown to the input at leads 209, 211 through resistor R3 and diode D3. The voltage across capacitor C3 reaches a voltage that is about the voltage on the transformer secondary winding W2 minus the voltage drop across diode D3. The voltage drop across the diode D3 can be determined through testing of the current-voltage characteristics of the diode, by adopting a diode manufacturer's represented biasing voltage values or by other conventional methods that can determine the voltage drop across the diode in its conducting state. Such voltage drop can be taken as the mean or medium voltage drop across the diode D3 over a range of characteristic current values for the desired application of circuit 200. Due to the arrangement of R3 and R4, rectifier D4, also referred to herein as diode D4, is also forward biased during $t_{on}$. Further, the current drawn by resistor R4 is negligible, and thus resistor R3 can be treated as being in a series electrical relationship with the anode of diode D4. Diode D4 is connected in a series relationship with the low end 220 of the voltage divider 216 and gate G2 of switch Q2. As diode D4 conducts, switch Q2, which is coupled to the input at leads 209, 211, conducts current. According to one aspect of the present teachings, switch Q2 is a N-channel NPN-type transistor, such as a bipolar junction transistor (BJT). As Q2 conducts, current flows through resistor R5, which is in series electrical relationship with the collector C2 and emitter E2 of switch Q2. According to another aspect of the present teachings, R5 and the collector C2 and emitter E2 of switch Q2 conduct current along a path parallel to C3, such path starting at the junction of D3 and R5 and ending at the junction of the emitter E2 with ground or common. According to one aspect of the present teachings, this conduction path also provides a discharge path for C3 in the event that the voltage across the secondary winding W2 falls quickly, such as when the voltage $V_{DC1}$ is removed quickly.

During $t_{off}$, Q2 is turned off, and the change in polarity of the voltage in the secondary winding W2 results in diodes D3 and D4 becoming reversed biased, which prevents capacitor C3 from charging or discharging. Thus, during $t_{on}$, capacitor C3 is effectively sampling $V_{DC1}$, and when the current though winding W1 is modulated to the off state, $t_{on}$ ends and $t_{off}$ begins. At this point, $V_{W2}$ is no longer dependent on the instantaneous value of $V_{DC1}$, and C3 is no longer sampling $V_{DC1}$ through $V_{W2}$ but rather stays at the last measured voltage.

An estimate of the voltage $V_{DC1}$ can be determined by the value of the voltage $V_{OUT}$ measured at the output across C3 at leads 224, 226. An estimate of $V_{DC1}$, which can be referred to herein as $V_{ESTIMATE}$ can be expressed as dependent on $V_{OUT}$ according to the following equation, which is based on an effectively series current path from the secondary winding W2 through resistor R3, diode D3, resistor R5 and switch Q2:

$$V_{ESTIMATE}=[(V_{OUT}-V_{CE2})\times(1+R3/R5)+V_{D3}+V_{CE2}]\times N1/N2$$

where $V_{CE2}$ is the voltage drop between the collector C2 of Q2, and the emitter E2 of Q2. If R5 is selected to be much greater than R3, the value of R3/R5 becomes sufficiently small that $V_{ESTIMATE}$ can be expressed as:

$$V_{ESTIMATE}=(V_{OUT}+V_{D3})\times N1/N2.$$

According to one aspect of the present teachings, values for the various components of the detection circuit 102 are as follows: R3=22 Ohm, R4=10000 Ohm, R5=1000 Ohm, C3=47 nF. According to one aspect of the present teachings, R5 has a resistance greater than or equal to ten times the resistance of R3, inclusive. According to another aspect of the present teachings, R5 has a resistance greater than or equal to forty times the resistance of R3, inclusive. According to yet another aspect of the present teachings, R5 has a resistance greater than or equal to one hundred times the resistance of R3, inclusive. While not necessary according to the present teachings, other values of R3 and R5 are possible where R5 has even greater resistance relative to R3, such as up to thousands of times greater relative value.

According to one aspect of the present teachings, during $t_{on}$ the voltage across inputs 209, 211 has equaled or exceeded a threshold value sufficient to cause switch Q2 to conduct current. When switch Q2 is in a conducting state, capacitor C3 can discharge through the path through resistor R5 and the collector C2 and emitter E2 of switch Q2. The path from the cathode of diode D3, through R5, the collector C2 and emitter E2 is parallel to the sampling capacitor C3. According to one aspect of the present teachings, diode D3 can conduct depending on whether the voltage across the diode D3 is equal to or exceeds a threshold value required for the diode D3 to conduct in the forward direction. As shown in FIG. 2, the diode D3 will conduct when the value of the voltage at the output 222 of the voltage divider formed by R3 and R4 minus the output $V_{OUT}$ equals or exceeds the threshold voltage value required for diode D3 to conduct.

According to one aspect of the present teachings, during $t_{on}$, under the condition where the input voltage value across inputs 209, 211 is sufficiently high and the difference between the output $V_{OUT}$ and voltage across inputs 209, 211 is sufficiently high, the switch Q2 conducts and diode D3 conducts. Under this condition, current flowing across D3 charges the capacitor C3, which increases the voltage at the output $V_{OUT}$. While D3 and Q2 conduct, the voltage across C3 will increase until reaching the voltage across serially connected R5 and the collector C2 and emitter E2 of switch Q2. Under circumstances during $t_{on}$ where the input value is sufficiently high, but the difference between the output and input is not sufficiently high to cause D3 to conduct, D3 does not conduct and switch Q2 continues to conduct. This allows the voltage across $V_{OUT}$ to decrease as the capacitor discharges through resistor R5.

According to another aspect of the present teachings, during $t_{off}$ the voltage across inputs 209, 211 is reduced such that switch Q2 no longer conducts and the voltage difference across D3 is also insufficient to achieve conduction across D3. During $t_{off}$, charging capacitor C3 will maintain its voltage as diode D3 prevents reverse flow of current and no current is conducted through R5 and switch Q2. According to one aspect of the present teachings, the voltage across C3 will remain about constant over the time period $t_{off}$.

With reference to FIG. 3, a voltage versus time graph of an example waveform representing $V_{DC1}$ is shown. The illustrated waveform can represent a $V_{DC1}$ that could be provided to circuit 100 or 200 described above. As illustrated, $V_{DC1}$ has a constant value from time $t_0$ to time $t_1$, and a linearly decreasing value from time $t_1$ to time $t_3$.

With reference to FIG. 4, a voltage versus time graph of an example waveform representing $V_{G1}$ is shown. The voltage $V_{G1}$ represents a voltage signal that can be applied to the gate G1 of switch Q1 in circuit 200 described above. From the time $t_0$ to time $t_3$, $V_{G1}$ shows intermittent square wave pulses, for example as can be provided by regulator 210. The successive pulses have a fixed voltage value but different durations. In FIG. 4, the pulse width 400 of the first pulse is the shortest of the three illustrated pulses. The first pulse is triggered at $t_0$ for the duration of interval 400, which is shorter than the time interval between $t_0$ and $t_1$. The second pulse is triggered at $t_1$, and ends after interval 402, which is shorter than the time between $t_1$ and $t_2$. The last pulse is triggered at $t_2$, and lasts for a duration 404, which is shorter than the duration between $t_2$ and $t_3$.

With reference to FIG. 5, a voltage $V_{W2}$, which is the potential across the secondary winding W2, is shown from time $t_0$ to $t_3$. As can be seen by comparison of FIGS. 4 and 5, the voltage across the secondary winding $V_{W2}$ goes from positive during the interval 400 when the first pulse is applied to gate G1, to negative when the pulse ends after interval 400. $V_{W2}$ stays negative until the next pulse is applied at $t_1$, at which point $V_{W2}$ swings from negative to positive for the duration of interval 402. After interval 402 ends, $V_{W2}$ goes from positive to negative until the next pulse is applied at $t_2$. $V_{W2}$ goes positive at $t_2$ for the time interval 404, at which point $V_{W2}$ goes negative.

With reference to FIG. 6, the output voltage $V_{OUT}$ is shown as measured at the output leads 224, 226 of detection circuit 200 while having the voltage $V_{DC1}$ applied during the same timeframe as shown in FIG. 3. As can be seen by comparison of FIGS. 3-6, capacitor C3 indirectly samples the voltage $V_{DC1}$ as measured across the leads 224, 226 during the time intervals 400, 402 and 404. During intervals 402 and 404, for example, the output $V_{OUT}$ drops from initial values at $t_1$ and $t_2$ to relatively lower values at the end of intervals 402 and 404, respectively. When the intervals end, C3 ceases to sample as the voltage across the winding W2 has reversed polarity. The switch in polarity in the secondary winding results in Q2 switching to a non-conducting state. At the points in time where switch Q2 switches to a non-conducting state, capacitor C3 holds the last sampled voltage until switch Q2 begins to conduct again. The decrease in the voltage $V_{DC1}$ is reflected in the decreasing voltages measured at $V_{OUT}$ during the sampling intervals 402 and 404. Conversely, when $V_{DC1}$ does not change in value over a sampling period such as during interval 400, the output voltage $V_{OUT}$ will also not change after it has reached the voltage value for $V_{OUT}$ that is representative of the input DC voltage $V_{DC1}$. According to one aspect of the present teachings, the detection circuits 102 do not need any synchronization circuitry to control sampling periods, as the detection circuitry 102 uses the switch in polarity of the secondary winding W2 to allow indirect sampling of $V_{DC1}$. In the illustrated example, the detection circuit 102 samples during the time periods during which switch Q1 is turned on to provide current to the transformer T, and thereby provide energy sufficient to generate a regulated DC voltage $V_{DC2}$.

For the purposes of this disclosure and unless otherwise specified, "a" or "an" means "one or more." To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term. From about A to B is intended to mean from about A to about B, where A and B are the specified values.

While the present disclosure illustrates various embodiments, and while these embodiments have been described in some detail, it is not the intention of the applicant to restrict or in any way limit the scope of the claimed invention to such detail. Additional advantages and modifications will be apparent to those skilled in the art. Therefore, the invention, in its broader aspects, is not limited to the specific details and illustrative examples shown and described. Accordingly, departures may be made from such details without departing from the spirit or scope of the applicant's claimed invention. Moreover, the foregoing embodiments are illustrative, and no single feature or element is essential to all possible combinations that may be claimed in this or a later application.

The invention claimed is:

1. A voltage measuring apparatus, comprising:
    an input configured to be coupled to a secondary of an inductive coupling of a DC to DC voltage converter;
    an output;
    a sampling capacitor coupled to the output;
    a switch coupled to the input and forming a discharge path parallel to the sampling capacitor dependent on an input voltage at the input equaling or exceeding a first voltage and independent of an output voltage at the output; and,
    a rectifier in a series relationship with the sampling capacitor, biased to conduct upon the input voltage, minus the output voltage, equaling or exceeding a second voltage, wherein when the switch is turned on the sampling capacitor is charged to a voltage of the secondary of the inductive coupling and when the switch is turned off the sampling capacitor holds a last charged voltage of the secondary of the inductive coupling.

2. The apparatus of claim 1, wherein the sampling capacitor is coupled in parallel across the output.

3. The apparatus of claim 2, wherein the switch is configured to conduct current parallel to the sampling capacitor.

4. The apparatus of claim 3, further comprising:
    a first and second resistor, the first resistor coupled to the input and the second resistor, the second resistor having a resistance great than or equal to 10 times the resistance of the first resistor and configured to conduct current parallel to the sampling capacitor.

5. The apparatus of claim 4, wherein the rectifier includes a silicon diode.

6. The apparatus of claim 4, wherein the switch forms a conduction path including the switch when the input voltage equals or exceeds the first voltage and the input voltage minus the output voltage does not equal or exceed the second voltage.

7. The apparatus of claim 6, wherein the conduction path includes the second resistor.

8. The apparatus of claim 7, wherein the second resistor is in series with the switch.

9. The apparatus of claim 4, wherein the first resistor is in series electrical relationship with a terminal of the charging capacitor and the rectifier, the second resistor in series electrical relationship with the switch, the switch and second resistor configured to conduct current parallel to the charging capacitor.

10. The apparatus of claim 4, further comprising a voltage divider including a high voltage side connected to the input and a low voltage side connected to an anode of a second rectifier, wherein the second rectifier is connected to a gate of the switch, the voltage divider further including an output side connected to an anode of the rectifier.

11. A voltage measuring apparatus for measuring a DC voltage to DC voltage converter that includes an inductive coupling having a primary winding and secondary winding electrically isolating input DC voltage from an output of the DC voltage to DC voltage converter, the secondary winding configured to switch polarity when current across the primary winding is modulated between conducting and non-conducting states, comprising:
    an input configured to be coupled to the secondary winding of an inductive coupling of a DC to DC voltage converter;
    an output;
    a capacitor coupled to the output;
    a switch coupled to the input and capable of modulation between a conducting state and nonconducting states based on an input voltage at the input equaling or exceeding a first threshold voltage and independent of an output voltage at the output, the switch capable of conducting current parallel to the capacitor when in the conducting state; and,
    a rectifier in a series relationship with the capacitor, biased to conduct upon the input voltage, minus the output voltage, equaling or exceeding a second threshold voltage, wherein when the switch is turned on the capacitor is charged to a voltage of the secondary winding and when the switch is turned off the capacitor holds a last charged voltage of the secondary winding.

12. The apparatus of claim 11, wherein the capacitor is coupled in parallel across the output.

13. The apparatus of claim 12, wherein the switch is configured to conduct along a path parallel to the capacitor.

14. The apparatus of claim 13, further comprising:
    a first and second resistor, the first resistor coupled to the input and in series relationship with the capacitor, the second resistor having a resistance greater than or equal to 10 times the resistance of the first resistor and configured to conduct current in series relationship with the switch along the path parallel to the sampling capacitor; and
    a voltage divider including a high voltage side connected to the input and a low voltage side connected to an anode of a second rectifier, wherein the second rectifier is connected to a gate of the switch, the voltage divider further including an output side connected to an anode of the rectifier.

15. The apparatus of claim 14, wherein the rectifier includes a silicon diode.

16. The apparatus of claim 14, wherein the switch forms a conduction path including the switch when the input voltage equals or exceeds the first threshold voltage and the input voltage minus the output voltage does not equal or exceed the second threshold voltage.

17. The apparatus of claim 16, wherein the conduction path includes the second resistor.

18. The apparatus of claim 17, wherein the second resistor is in series with the switch.

19. A voltage measuring apparatus, comprising:
an input configured to be coupled to an isolating coupling of a DC to DC voltage converter;
an output;
a capacitor coupled to the output;
a switch coupled to the input and parallel to the capacitor, capable of being modulated based on an input voltage at the input equaling or exceeding a first threshold voltage and independent of an output voltage at the output;
a first and second resistor, the first resistor coupled to the input and in series relationship with the capacitor, the second resistor having a resistance greater than or equal to 10 times the resistance of the first resistor and configured to conduct current in series relationship with the switch along a path parallel to the capacitor; and,
a rectifier in a series relationship with the capacitor, biased to conduct upon the input voltage, minus the output voltage, equaling or exceeding a second threshold voltage, wherein when the switch is turned on the capacitor is charged to a voltage of the isolating coupling and when the switch is turned off the capacitor holds a last charged voltage of the isolating coupling.

20. The apparatus of claim 19, wherein the capacitor is coupled in parallel across the output and the switch is configured to conduct along a path parallel to the capacitor, and further comprising a voltage divider including a high voltage side connected to the input and a low voltage side connected to an anode of a second rectifier, wherein the second rectifier is connected to a gate of the switch, the voltage divider further including an output side connected to an anode of the rectifier.

* * * * *